US012014921B2

(12) United States Patent
Dhas et al.

(10) Patent No.: US 12,014,921 B2
(45) Date of Patent: Jun. 18, 2024

(54) PLASMA ENHANCED WAFER SOAK FOR THIN FILM DEPOSITION (71) Applicant: Lam Research Corporation, Fremont, CA (US)

(72) Inventors: Arul N. Dhas, Sherwood, OR (US); Ming Li, West Linn, OR (US); Tu Hong, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 386 days.

(21) Appl. No.: 17/309,014

(22) PCT Filed: Oct. 2, 2019

(86) PCT No.: PCT/US2019/054226
§ 371 (c)(1),
(2) Date: Apr. 13, 2021

(87) PCT Pub. No.: WO2020/081235
PCT Pub. Date: Apr. 23, 2020

(65) Prior Publication Data
US 2021/0366705 A1    Nov. 25, 2021

Related U.S. Application Data (60) Provisional application No. 62/746,318, filed on Oct. 16, 2018.

(51) Int. Cl.
*H01L 21/02*    (2006.01)
*C23C 16/455*   (2006.01)
*H01L 21/67*    (2006.01)

(52) U.S. Cl.
CPC .. *H01L 21/02274* (2013.01); *C23C 16/45536* (2013.01); *H01L 21/67017* (2013.01); *H01L 21/67098* (2013.01)

(58) Field of Classification Search
CPC ......... H01L 21/02274; H01L 21/67017; H01L 21/67098; H01L 21/02164;
(Continued)

(56) References Cited

U.S. PATENT DOCUMENTS 6,559,026 B1   5/2003   Rossman et al.
7,879,409 B2   2/2011   Furuta et al.
(Continued)

FOREIGN PATENT DOCUMENTS

KR   20010107765 A   12/2001
TW      200605196 A    2/2006
WO   WO2008-045226    4/2008

OTHER PUBLICATIONS

International Preliminary Report on Patentability and the Written Opinion of the International Searching Authority, dated Apr. 14, 2021, for International Patent Application No. PCT/US2019/054226.
(Continued)

*Primary Examiner* — Yasser A Abdelaziez
(74) *Attorney, Agent, or Firm* — Weaver Austin Villeneuve & Sampson LLP (57) ABSTRACT

Disclosed are apparatuses and methods for providing a substrate onto a substrate support in a processing chamber, generating an inert plasma in the processing chamber, and maintaining the inert plasma to heat the substrate to a steady state temperature, suitable for conducting plasma-enhanced chemical vapor deposition (PECVD), in less than 30 seconds from providing the substrate onto the substrate support. An apparatus may include a processing chamber, a process station that includes a substrate support, a process gas unit configured to flow an inert gas onto a substrate supported by the substrate support, a plasma source configured to generate an inert plasma in the process station, and a controller with instructions configured to flow the inert gas onto the sub- (Continued)

strate, generate the inert plasma in the first process station, and maintain the inert plasma to thereby heat the substrate.

18 Claims, 6 Drawing Sheets

(58) Field of Classification Search
CPC ......... H01L 21/02211; H01L 21/02315; H01L 21/324; H01L 21/02301; H01L 21/67248; H01L 21/67276; C23C 16/45536; C23C 16/0209; C23C 16/0236; C23C 16/4586; C23C 16/46; C23C 16/481; C23C 16/505; C23C 16/52; H01J 37/32165; H01J 37/32357; H01J 37/32449; H01J 37/32724
See application file for complete search history.

(56) References Cited

U.S. PATENT DOCUMENTS

| | | |
|---|---|---|
| 9,299,558 B2 | 3/2016 | Zhao et al. |
| 9,847,221 B1 | 12/2017 | McLaughlin et al. |
| 2004/0144490 A1 | 7/2004 | Zhao et al. |
| 2008/0003358 A1* | 1/2008 | Yim .................... C23C 16/4401 427/248.1 |
| 2011/0041873 A1 | 2/2011 | Furuta et al. |
| 2015/0004806 A1 | 1/2015 | Ndiege et al. |
| 2020/0367320 A1* | 11/2020 | Oka .................. H01L 21/67063 |

OTHER PUBLICATIONS

TW Office Action dated Dec. 29, 2023 in TW Application No. 108136994 with English translation.
TW Office Action dated Jul. 6, 2023, in application No. TW108136994 with English translation.
Notification of the Transmittal of the International Search Report and the Written Opinion of the International Searching Authority, the International Search Report, and the Written Opinion of the International Searching Authority, dated Jan. 17, 2020, for International Patent Application No. PCT/US2019/054226.
KR Office Action dated Feb. 15, 2024 in KR Application No. 10-2021-7014466, with English Translation.

* cited by examiner

| Trial | Plasma heat time (sec) | Total heat time (sec) | Soak He (sccm) | Soak N2 (sccm) | THK Stn1 (Å) | THK Stn2 (Å) | Delta THK (Å) | RI Stn1 | RI Stn2 | Delta RI |
|---|---|---|---|---|---|---|---|---|---|---|
| 1 | 0 | 20 | 10000 | 0 | 307.3 | 299.9 | 7.5 | 1.810 | 1.827 | -0.017 |
| 2 | 0 | 30 | 10000 | 0 | 300.3 | 294.6 | 5.7 | 1.873 | 1.876 | -0.003 |
| 3 | 0 | 20 | 10000 | 10000 | 302.0 | 294.6 | 7.4 | 1.865 | 1.872 | -0.007 |
| 4 | 0 | 30 | 10000 | 10000 | 298.8 | 294.1 | 4.7 | 1.867 | 1.879 | -0.013 |
| 5 | 10 | 20 | 10000 | 0 | 306.7 | 301.1 | 5.7 | 1.866 | 1.874 | -0.008 |
| 6 | 10 | 30 | 10000 | 0 | 304.1 | 299.8 | 4.2 | 1.870 | 1.879 | -0.008 |
| 7 | 10 | 20 | 10000 | 10000 | 307.2 | 303.4 | 3.8 | 1.817 | 1.822 | -0.005 |
| 8 | 10 | 30 | 10000 | 10000 | 302.2 | 298.3 | 3.9 | 1.867 | 1.874 | -0.007 |

PLASMA ENHANCED WAFER SOAK FOR THIN FILM DEPOSITION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Semiconductor fabrication often involves using plasma-enhanced chemical vapor deposition ("PECVD") to deposit one or more layers of material onto a heated substrate. However, this conventional PECVD processing may result in substrate defects and slow throughput times. As a result, methods and techniques are sought to reduce the defects and improve substrate throughput.

SUMMARY

In some embodiments a method may be provided. The method may include providing a substrate onto a substrate support in a processing chamber, generating an inert plasma in the processing chamber, and maintaining the inert plasma to heat the substrate to a steady state temperature, suitable for conducting plasma-enhanced chemical vapor deposition (PECVD), in less than 30 seconds from providing the substrate onto the substrate support.

In some embodiments, the substrate support may be heated.

In some such embodiments, the substrate may be heated by a combination of the inert plasma and radiation from the substrate support.

In some further such embodiments, the substrate may be first heated by radiation from the substrate support and then heated by the combination of the inert plasma and radiation from the substrate support.

In some further such embodiments, the substrate may be first heated by radiation from the substrate support for between 5 seconds and 10 seconds before being heated by the combination of the inert plasma and radiation from the substrate support.

In some embodiments, the substrate may be heated from room temperature to a temperature of at least 300° C.

In some such embodiments, the substrate may be heated from room temperature to a temperature of between 300° C. and 700° C.

In some embodiments, the substrate may reach the steady state temperature in 20 seconds or less.

In some embodiments, the generating the inert plasma may include flowing an inert gas into the processing chamber, and striking the inert plasma.

In some such embodiments, the inert gas may be helium, nitrogen, and a combination of helium and nitrogen.

In some such embodiments, the inert gas may be a combination of helium and nitrogen.

In some embodiments, the chamber partial pressure during the flowing of the inert gas may be about 8 Torr.

In some embodiments, an inert gas partial pressure prior to striking the inert plasma may be reached in no more than 10 seconds, and then the steady state temperature of the substrate may be thereafter reached in no more than 10 seconds.

In some embodiments, the method may further include depositing, while the substrate is at the steady state temperature and while a reactant plasma is generated in the processing chamber, a layer of material on the substrate by PECVD.

In some such embodiments, the method may further include extinguishing the inert plasma after the substrate reaches the steady state temperature and before the depositing, and the depositing may further include flowing, a reactant process gas onto the substrate, and generating a reactant plasma in the processing chamber.

In some such embodiments, the depositing may include flowing a reactant process gas onto the substrate while maintaining the inert plasma and thereby changing the inert plasma to a reactant plasma without extinguishing the inert plasma.

In some further such embodiments, the depositing may further include flowing the reactant process gas and flowing an inert gas onto the substrate.

In some further such embodiments, the inert plasma may be generated at a first power level and the reactant plasma may be generated at a second power level.

In some such embodiments, the method may further include purging, before the depositing, the processing chamber.

In some embodiments, a frequency of the inert plasma may be 13.56 MHz.

In some embodiments, the method may further include flowing, during the maintaining of the inert plasma, a surface treatment gas that includes a cleaning molecule and a surface treatment molecule.

In some embodiments, an apparatus may be provided. The apparatus may include a processing chamber, a first process station that includes a first substrate support, and the first substrate support may be configured to position a first substrate in the processing chamber, a process gas unit configured to flow an inert gas onto the first substrate supported by the first substrate support, a plasma source configured to generate an inert plasma in the first process station, and a controller. The controller may include instructions that are configured to provide the first substrate onto the first substrate support, flow the inert gas onto the first substrate that is supported by the first substrate support, generate, while the inert gas is flowed onto the first substrate that is supported by the first substrate support, the inert plasma in the first process station, and maintain the inert plasma to thereby heat the first substrate to a steady state temperature, suitable for conducting plasma enhanced chemical vapor deposition, in less than 30 seconds from providing the first substrate onto the first substrate support.

In some embodiments, the first substrate support may be further configured to generate heat to heat the first substrate that is supported by the first substrate support, and the controller may further include instructions that are configured to cause first substrate support to generate heat, and maintain the inert plasma while the first substrate support generates heat to thereby heat the first substrate to a steady state temperature by a combination of the inert plasma and radiation from the first substrate support.

In some embodiments, the process gas unit may be further configured to flow a reactant gas onto the first substrate supported by the first substrate support, the plasma source may be configured to generate a reactant plasma in the first process station, and the controller may further include instructions that are configured to flow the reactant gas onto the first substrate that is supported by the first substrate support, and generate, while the reactant gas is flowed onto the first substrate that is supported by the first substrate support, the reactant plasma in the first process station to thereby deposit a layer of material on the first substrate.

In some embodiments, the plasma source may be configured to generate the inert plasma at a frequency of 13.56 MHz.

In some embodiments, the plasma source may be configured to generate the inert plasma at a power between 200 Watts and 800 Watts.

In some embodiments, the apparatus may further include a second process station, the second process station may include a second substrate support, the second substrate support may be configured to position a second substrate in the processing chamber, the process gas unit may further be configured to flow the inert gas onto the second substrate supported by the second substrate support, the plasma source may further be configured to generate the inert plasma in the second process station, and the controller may further include instructions that are configured to provide the second substrate onto the second substrate support, flow the inert gas onto the second substrate that is supported by the second substrate support, generate, while the inert gas is flowed onto the second substrate that is supported by the second substrate support, the inert plasma in the first process station, and maintain the inert plasma in the second process station to thereby heat the second substrate to the steady state temperature in less than 30 seconds from providing the second substrate onto the second substrate support.

In some such embodiments, the second substrate support may be further configured to generate heat to heat the second substrate that is supported by the second substrate support, and the controller may further include instructions that are configured to cause second substrate support to generate heat, and maintain the inert plasma while the second substrate support generates heat to thereby heat the second substrate to the steady state temperature by a combination of the inert plasma and radiation from the second substrate support.

In some further such embodiments, the process gas unit may be further configured to flow a reactant gas onto the second substrate supported by the second substrate support, the plasma source may be further configured to generate a reactant plasma in the second process station, and the controller may further include instructions that are configured to flow the reactant gas onto the second substrate that is supported by the second substrate support, and generate, while the reactant gas is flowed onto the second substrate that is supported by the second substrate support, the reactant plasma in the second process station to thereby deposit a layer of material on the second substrate.

In some other such embodiments, the reactant gas may include a silicon.

In some other such embodiments, the reactant gas may include a silane.

In some other such embodiments, the reactant gas may include a tetra-ethoxy-silane.

In some other such embodiments, the reactant gas may include a tetra-methyl-silane.

In some embodiments, the inert gas may include helium, nitrogen, and a combination of helium and nitrogen.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry may have a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards glass panels, and the like.

Heating in Plasma-Enhanced Chemical Vapor Deposition

Many semiconductor fabrication processes deposit materials using plasma-enhanced chemical vapor deposition ("PECVD"). In a typical PECVD reaction, a substrate is heated to an operating temperature and exposed to one or more volatile precursors which react and/or decompose to produce the desired deposit on the substrate surface. The PECVD process generally begins by flowing one or more reactants into the reaction chamber. The reactant delivery may continue as a plasma is generated which exposes the substrate surface to the plasma, which in turn causes deposition to occur on the substrate surface. This process continues until a desired film thickness is reached, after which the plasma is generally extinguished and the reactant flow is terminated. Next, the reaction chamber may be purged and post-deposition steps may be performed.

The operating temperature of the substrate and processing chamber is generally selected based on the processing performed on the substrate, such as pre-processing steps, deposition steps, and post-deposition processing steps. For example, the operating temperature of the substrate and the reaction chamber during the PECVD reaction and deposition may be between about 50-450° C., in certain embodiments. This range may be appropriate for reactions using a silane. Where other reactants are used, the temperature range may be more limited or more broad, for example between about 100-450° C. where a tetra-ethoxy-silane (TEOS) is used, or between about 200-700° C. Additionally, some pre-deposition processing steps, such as an ammonia clean, outgassing, or surface roughening of the substrate, may be performed at specific temperatures, such as 100-400° C. Some post-deposition steps, such as annealing, changing the composition, changing the refractive index (RI)/transparency of the layers, and changing the stress of the layers, may also be performed at specific temperatures, such as 100-400° C.

Substrates typically enter the processing chamber at temperatures lower than the operating temperature, such as room temperature which may be about 20-25° C., and are generally positioned onto a substrate support structure in the processing chamber and then heated to the operating temperature. Heating the substrate to an operating temperature is referred to herein as a "wafer soak," "thermal soak," "temperature soak," "soak" or "substrate soak." In order to heat the substrate to the desired operating temperature for pre-deposition and deposition processing, most conventional semiconductor processing tools use a heat source located within the substrate support structure to heat the substrate with thermal radiation. Heating the substrate to an operating temperature is referred to herein as a "wafer soak," "thermal soak," "temperature soak," or "substrate soak." As described in more detail below, the heat source of the substrate support structure may be a resistive heating element or fluid conduits through which heating fluid may flow.

The thermal soak process using only the heat source in the substrate support structure is a time-consuming step that limits and constrains substrate throughput. The speed at which the substrate is heated is constrained by, among other things, the ability of the heat source and substrate support structure elements to heat to the desired temperature, and to transfer the heat to the substrate. The traditional heat sources, such as resistive heating elements and heating fluid flow through fluid conduits, typically have limited, set times in which they are able to heat to the desired temperatures and to transfer the heat to the substrate. For instance, the temperature for a conventional temperature soak process may take up to 30 seconds, 60 seconds, or 120 seconds, which may be a substantial portion, such as 25%, 40%, 50%, or more, of the overall processing time. In one instance, a 30 second temperature soak may be part of an overall processing time (pre-deposition, deposition, and post-deposition steps) that is about 75 seconds, which is about 40% of the total processing time.

Accordingly, the present disclosure relates to techniques and apparatuses for heating a substrate using an inert plasma in order to reduce processing time, improve throughput, and improve substrate uniformity. In some embodiments, the substrate may be heated using both the inert plasma and the heat source in the substrate support structure.

Apparatuses

A suitable apparatus for performing the disclosed methods typically includes hardware for accomplishing the process operations and a system controller having instructions for controlling process operations in accordance with the present invention. For example, in some embodiments, the hardware may include one or more PECVD process stations included in a process tool.

Figure 1:
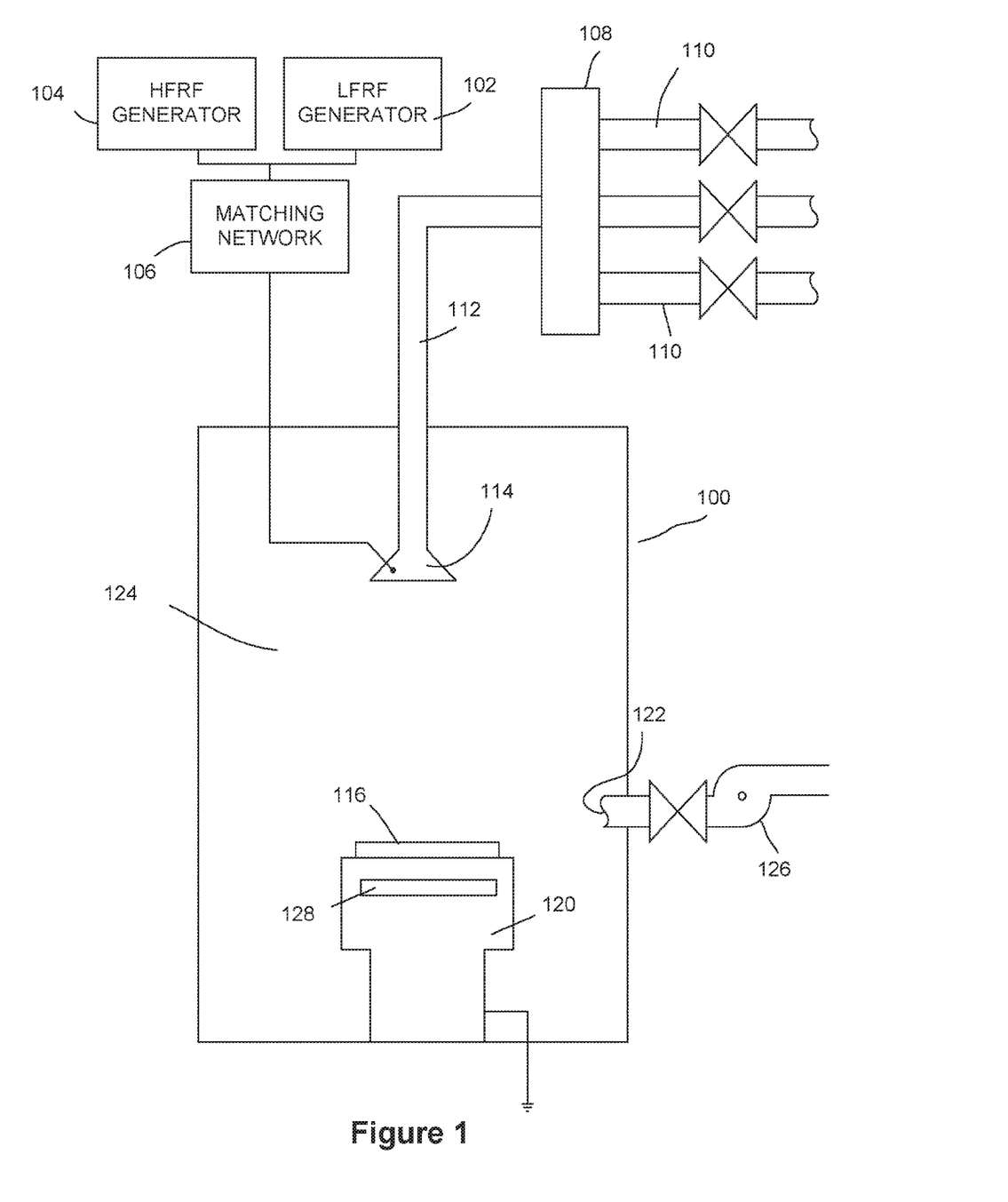
FIG. 1 provides a block diagram of an example apparatus that may be used to practice the disclosed embodiments.

FIG. 1 provides a block diagram of an example apparatus that may be used to practice the disclosed embodiments. As shown, a semiconductor processing tool 100 ("tool") includes a process chamber 124, which encloses other components of the reactor and serves to contain the plasma generated by, e.g., a capacitor type system including a showerhead 114 working in conjunction with a grounded heater block 128. A high-frequency RF generator 102, connected to a matching network 106, and a low-frequency RF generator 104 are connected to showerhead 114. The power and frequency supplied by matching network 106 is sufficient to generate a plasma from the process gas, for example 400-700 W total energy. In one implementation of the present invention both the HFRF generator and the LFRF generator may be used during deposition, while is some other implementations just the HFRF generator is used. In a typical process, the high frequency (HF") RF component is generally between about 2-60 MHz; in a preferred embodiment, the HF component is about 13.56 MHz. The low frequency ("LF") component is generally between about 250-400 kHz.

Within the reactor, a substrate support structure 120 (i.e., pedestal) supports a substrate 116. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

As noted above, in some embodiments the substrate support structure 120 includes a heat source 128 configured to heat a substrate positioned on the pedestal 120. The heat source 128 may have one or more an electrically resistive elements positioned within the pedestal 120 or wires routed in a serpentine or looping fashion within the pedestal 120. The electrically resistive elements may be controlled by heater wires that are connected to the electrically resistive element through a stem of the pedestal 120. Because the tool 100 uses RF energy during chamber operation, all or part of the electrically resistive element may be insulated and isolated from the RF. The RF isolation may be accomplished through an EMI/RFI filter or any other commercially available RF isolation device. In other embodiments the heat source 128 may be fluid conduits for the flow of a heating fluid, which includes liquids and gases, such as heated inert gases.

The pedestal 120 is also configured to conduct thermal radiation from the heat source 128 to the substrate 116 positioned on the pedestal 120. This may include thermally conductive layers of material within the pedestal 120 and at the surface of the pedestal 120, as well as thermal chokes within the pedestal 120 to direct thermal radiation towards the substrate 116.

The process gases are introduced via inlet 112. Multiple source gas lines 110 are connected to manifold 108. The gases may be premixed or not. Examples of process gases are described below. Appropriate valving and mass flow control mechanisms are employed to ensure that the correct gases are delivered during the deposition and post-deposition phases of the process. In the case that the chemical precursor delivered in liquid form, liquid flow control mechanisms are employed. The liquid is then vaporized and mixed with other process gases during its transportation in a manifold heated above its vaporization point before reaching the deposition chamber.

Process gases exit chamber 124 via an outlet 122. A vacuum pump 126 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used.

Figure 2:
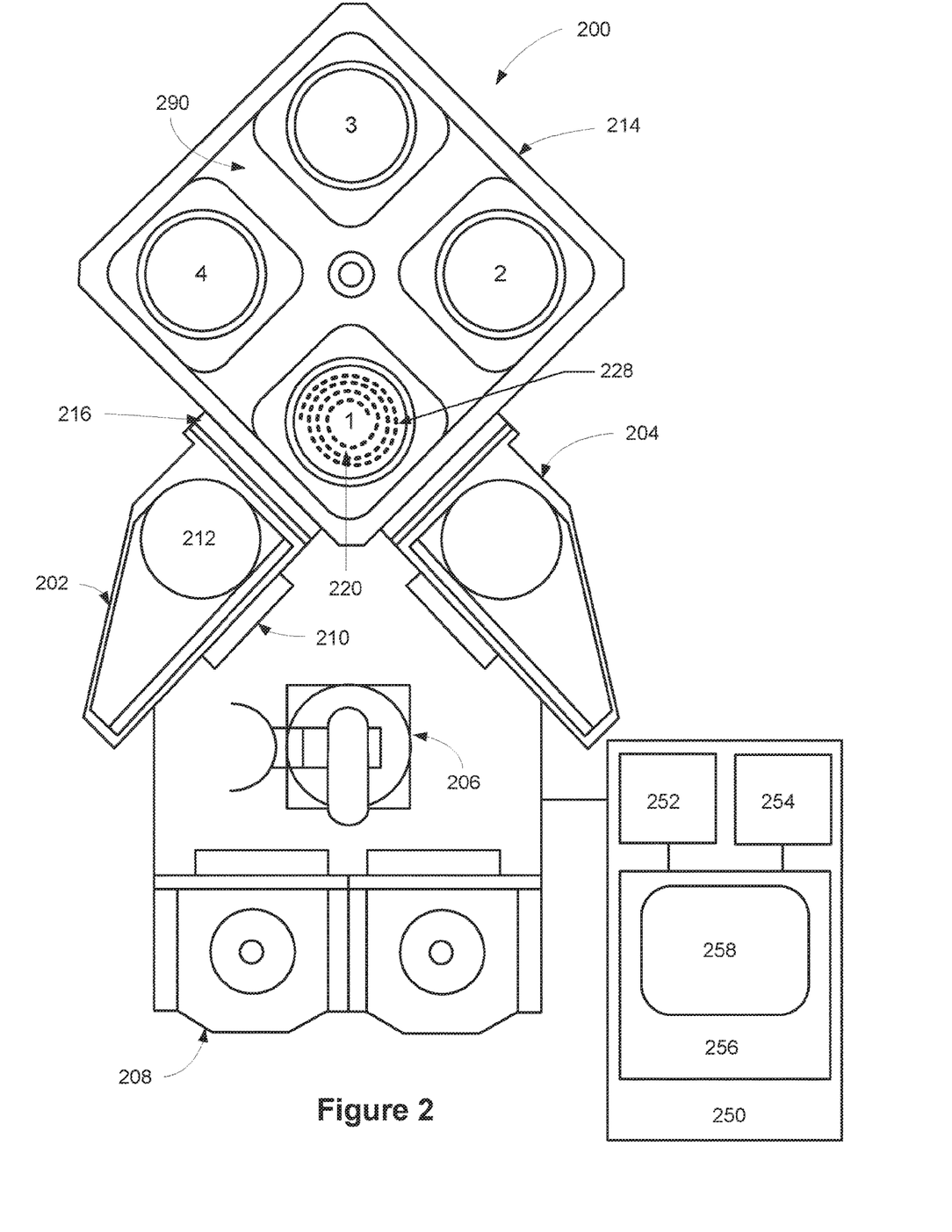
FIG. 2 shows a schematic view of an embodiment of a multi-station processing tool.

FIG. 2 shows a schematic view of an embodiment of a multi-station processing tool 200 with an inbound load lock 202 and an outbound load lock 204, either or both of which may comprise a remote plasma source. A robot 206, at atmospheric pressure, is configured to move wafers from a cassette loaded through a pod 208 into inbound load lock 202 via an atmospheric port 210. A wafer is placed by the robot 206 on a pedestal 212 in the inbound load lock 202, the atmospheric port 210 is closed, and the load lock is pumped down. Next, a chamber transport port 216 to processing chamber 214 is opened, and another robot (not shown) places the wafer into the reactor on a pedestal of a first station shown in the reactor for processing. While the embodiment depicted in FIG. 2 includes load locks, it will be appreciated that, in some embodiments, direct entry of a wafer into a process station may be provided.

The depicted processing chamber 214 comprises four process stations, numbered from 1 to 4 in the embodiment shown in FIG. 2. Each station has a heated pedestal (shown at 220 for station 1), and gas line inlets, like described above. For example, each pedestal includes a heat source (the dotted spiral labeled 228 for station 1) configured to heat a substrate positioned on the pedestal as described above.

It will be appreciated that in some embodiments, each process station may have different or multiple purposes. While the depicted processing chamber 214 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 2 also depicts an embodiment of a wafer handling system 290 for transferring wafers within processing chamber 214. In some embodiments, wafer handling system 290 may transfer wafers between various process stations and/or between a process station and a load lock. It will be appreciated that any suitable wafer handling system may be employed. Non-limiting examples include wafer carousels and wafer handling robots. FIG. 2 also depicts an embodiment of a system controller 250 employed to control process conditions and hardware states of process tool 200. System controller 250 may include one or more memory devices 256, one or more mass storage devices 254, and one or more processors 252. Processor 252 may include a CPU or computer, analog and/or digital input/output connections, stepper motor controller boards, etc.

While not shown in FIG. 2, tool 200 may include any feature of tool 100, such as the gases and piping for each station described above, as well as the vacuum pump. Furthermore, as referenced herein, tool 200 includes features configured to generate a plasma in each processing station, such as the capacitor type system including a showerhead working in conjunction with a grounded heater block, and the high-frequency RF generator connected to the matching network, for instance. The power and frequency supplied by matching network is sufficient to generate a plasma from the process gas, for example 400-700 W total energy for each station, or about 200-3,000 W total energy delivered to all stations (such as 600 W for a single station or 2,400 W for a four-station processing chamber which results in 600 W for each of the four stations). As stated above, both the HFRF generator and the LFRF generator may be used during deposition, while just the HFRF generator may be used in some implementations; the high frequency RF component is generally between about 2-60 MHz; in a preferred embodiment, the HF component is about 13.56 MHz.

In some embodiments, system controller 250 controls all of the activities of process tool 200. System controller 250 executes system control software 258 stored in mass storage device 254, loaded into memory device 256, and executed on processor 252. System control software 258 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 200. System control software 258 may be configured in any suitable way. For example, various process tool component subroutines or control objects may be written to control operation of the process tool components necessary to carry out various process tool processes in accordance with the disclosed methods. System control software 258 may be coded in any suitable computer readable programming language.

In some embodiments, system control software 258 may include input/output control (IOC) sequencing instructions for controlling the various parameters described above. For example, each PECVD process may include one or more instructions for execution by system controller 250. The instructions for setting process conditions for PECVD process phases may be included in a corresponding PECVD recipe phase. In some embodiments, the PECVD recipe phases may be sequentially arranged, so that all instructions for a PECVD process phase are executed concurrently with that process phase.

Other computer software and/or programs stored on mass storage device 254 and/or memory device 256 associated with system controller 250 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 220 and to control the spacing between the substrate and other parts of process tool 200.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to the heat source in a pedestal that is used to heat the substrate through thermal radiation. The heater control program may include instructions to maintain the temperature of the substrate within any of the disclosed ranges. As discussed below, the heater control program may also include instructions for executing the techniques described herein. This may include controlling the current to electrically resistive heating elements in the pedestal or the flow of heating fluid through conduits in the pedestal in order to heat the pedestal.

A plasma control program may include code for setting RF power levels and frequencies applied to the process electrodes in one or more process stations, for example using any of the RF power levels disclosed herein. The plasma control program may also include code for controlling the duration of each plasma exposure.

The system controller 250, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 250 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 250 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, there may be a user interface associated with system controller 250. The user interface may include a display screen, graphical software displays of the apparatus and/or process conditions, and user input devices such as pointing devices, keyboards, touch screens, microphones, etc.

In some embodiments, parameters adjusted by system controller 250 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 250 from various process tool sensors. The signals for controlling the process may be output on the analog and digital output connections of process tool 200. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Although not shown in FIG. 1, tool 100 may include any feature of tool 200, such as the controller 250 and the controller may be configured to execute any instruction described herein for tool 100.

Examples of processing gas reactants used for PECVD will now be discussed. At least one of the reactants will generally contain an element that is solid at room temperature, the element being incorporated into the film formed by the PECVD method. This reactant may be referred to as a principal reactant. The principal reactant typically includes, for example, a metal (e.g., aluminum, titanium, etc.), a semiconductor (e.g., silicon, germanium, etc.), and/or a non-metal or metalloid (e.g., boron). The other reactant is sometimes referred to as an auxiliary reactant or a co-reactant. Non-limiting examples of co-reactants include oxygen, ozone, hydrogen, hydrazine, water, carbon monoxide, nitrous oxide, ammonia, alkyl amines, and the like. The co-reactant may also be a mix of reactants, as mentioned above.

The PECVD process may be used to deposit a wide variety of film types and in particular implementations to fill gaps with these film types. Some may be used to form undoped silicon oxides, other film types such as nitrides, carbides, oxynitrides, carbon-doped oxides, nitrogen-doped oxides, borides, etc. may also be formed. Oxides include a wide range of materials including undoped silicate glass (USG), doped silicate glass. Examples of doped glasses included boron doped silicate glass (BSG), phosphorus doped silicate glass (PSG), and boron phosphorus doped silicate glass (BPSG). Still further, the PECVD process may be used for metal deposition and feature fill.

In certain embodiments, the deposited film is a silicon-containing film. In these cases, the silicon-containing reactant may be for example, a silane, a halosilane or an aminosilane. A silane contains hydrogen and/or carbon groups, but does not contain a halogen. Examples of silanes are silane ($SiH_4$), tetramethylsilane ($C_4H_{12}Si$; 4MS) disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho-silicate (also known as tetra-ethoxy-silane or TEOS) and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane $SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal g-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, bis(n-propylcyclopentadienyl)magnesium, etc.

In certain implementations, an oxygen-containing oxidizing reactant is used. Examples of oxygen-containing oxidizing reactants include oxygen, ozone, nitrous oxide, carbon monoxide, etc.

In some embodiments, the deposited film contains nitrogen, and a nitrogen-containing reactant is used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Other precursors, such as will be apparent to or readily discernible by those skilled in the art given the teachings provided herein, may also be used.

For example, in one embodiment, the PECVD reaction is performed with TEOS, 4MS, or a silane. The TEOS, 4MS, and silane reactants have been found to be especially useful in practicing the PECVD reaction.

The flow rate of reactants may vary depending on the desired process. In one embodiment related to PECVD undoped silicate glass (USG), $SiH_4$ is used as a reactant and has a flow rate between about 100-1,500 standard cubic centimeters per minute (sccm), with a flow of $N_2O$ between about 100-20,000 sum. In another embodiment related to PECVD using TEOS, the flow of TEOS is between about 1-20 mL/min, and the flow of $O_2$ is between about 100-30,000 sccm.

The process gases may also include flowing inert gases into the process chamber, such as argon, nitrogen, helium, or mixtures thereof, as well as purge gases (which may be inert gases) and cleaning gases.

Using a Plasma to Heat a Substrate for PECVD

Figure 3:
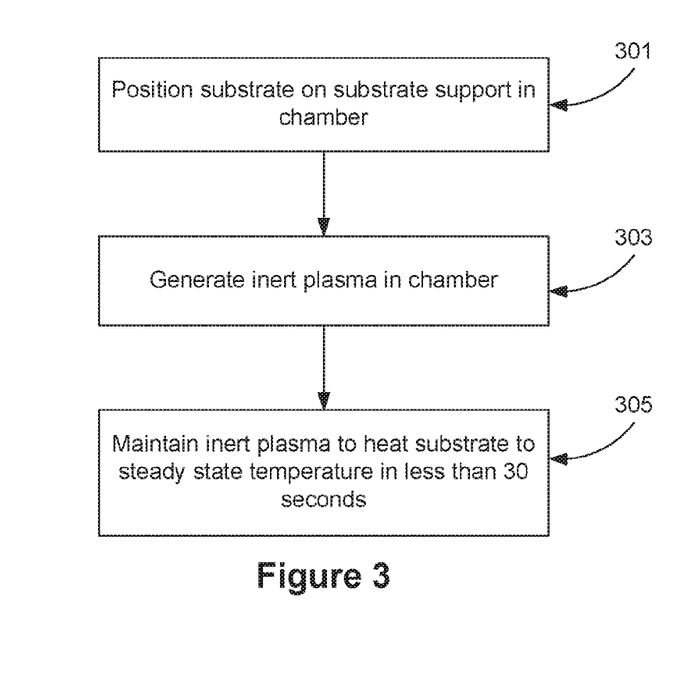
FIG. 3 depicts an example process flow diagram for performing operations in accordance with disclosed embodiments

Various techniques for using a plasma to heat a substrate during the temperature soak will now be discussed. FIG. 3 depicts an example process flow diagram for performing operations in accordance with disclosed embodiments. In operation 301, the substrate is positioned onto the substrate support, or pedestal, in a processing chamber as described above. For multi-station embodiments, this includes positioning one substrate onto at least one of the multiple stations, such as all stations each having a substrate positioned on the station's pedestal. This may include an indexing operation.

In operation 303, an inert plasma is generated in the processing chamber. The plasma may be a capacitively coupled plasma, a remotely generated inductively coupled plasma, or a remote plasma source (such as an upper or lower remote plasma source). For single-station embodiments, operation 303 generates the inert plasma in the processing chamber for the single station. In the multi-station embodiments, operation 303 simultaneously generates the inert plasma one or more stations, such as all of the stations.

As stated above, in some embodiments, an RF signal may be used to drive plasma formation which may only contain a HF component and not a LF component. The HF frequency may be about 13.56 MHz or about 27 MHz. The HF RF power used to drive the inert plasma formation may be between about 200-3,000 W, which may be power levels to each station or collectively to all of the stations. In some other embodiments, the frequency used to drive the inert plasma formation contain both LF and HF components. As noted above, the LF frequency may be between about 300-400 kHz and the LF RF power used to drive plasma formation may be between about 200-2,500 W.

The pressure in the reaction chamber during operation 301, as well as operations 303 and 305, may be between about 1-10 Torr, for example about 8 Torr or 5 Torr. In some embodiments, the inert plasma generation includes flowing an inert gas into the processing chamber and onto the substrate, and striking the inert plasma. The inert gases may be helium (He), nitrogen ($N_2$), and a combination of helium and nitrogen (He/$N_2$). The flow rate of such inert gases may be between 100-30,000 sccm, including about 10,000 sccm.

In operation 305, the plasma is maintained in the processing chamber in order to heat the substrate to a steady state operating temperature for PECVD processing. In some embodiments, maintaining the plasma heats the substrate to the steady state temperature is less than 30 seconds, or in some embodiments 20 seconds or less. In many typical PECVD processes, the temperature soak is performed for 30 seconds or more in order for the substrate to reach the steady state temperature, but utilizing the techniques described herein enables the substrate to be heated to the steady state temperature in less than 30 seconds because of the above-mentioned limitations of conventional tools. In some embodiments, the steady state temperature may be between 200-700° C., between 300-700° C., such as at least 300° C., 450° C., and 650° C. Deposition using PECVD may be performed once the substrate is at the steady state temperature.

Figure 4:
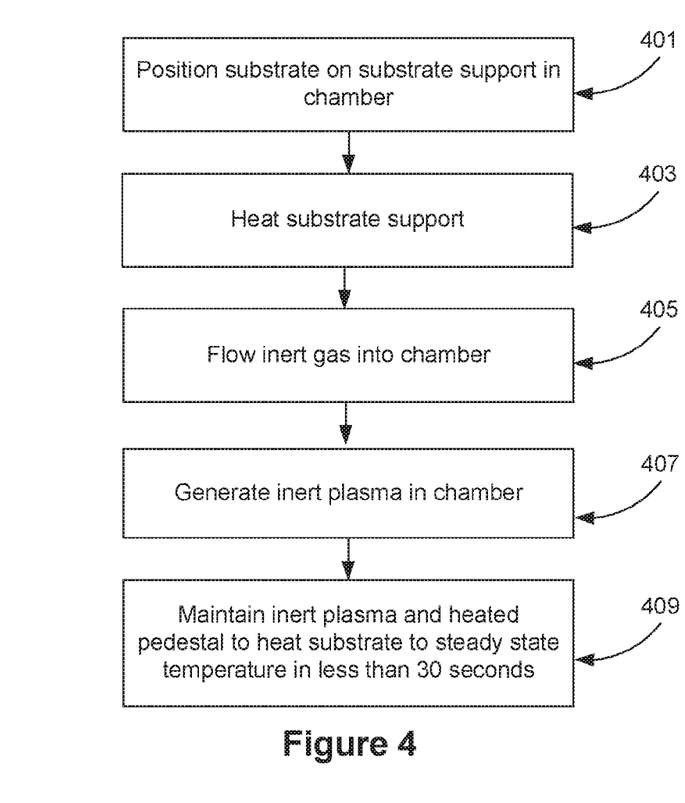
FIG. 4 depicts a second example process flow diagram for performing operations in accordance with disclosed embodiments.

In some embodiments, the substrate may be heated during the temperature soak using a combination of the plasma and a heated pedestal. FIG. 4 depicts a second example process flow diagram for performing operations in accordance with disclosed embodiments. In the technique of FIG. 4, the substrate support is a heated substrate support that heats the substrate in combination with the inert plasma. In operation 401, the substrate is positioned onto the pedestal, like in operation 301. In operation 403, the pedestal is heated like described above, such as with generating heat a resistive heating source, such that the pedestal emits thermal radiation which heats the substrate positioned on the pedestal. Operation 403 may be performed before, after, or simultaneously with operation 401. In the technique of FIG. 4, the pedestal is heated after the substrate is positioned onto the pedestal.

After operation 403, operation 405 is performed in which an inert gas is flowed into the chamber and onto the substrate, as described above. In some embodiments, the inert gas may be He, $N_2$, or a combination of He/$N_7$ and the flow rate of these gases may be between 100-30,000 sccm, including about 10,000 sccm. In some embodiments, the chamber partial pressure during this flowing of the inert gas is between about 0.5 Torr and 10 Torr, such as 8 Torr. While the inert gas is flowing, the inert plasma is generated in operation 407, like operation 303 described above. In some embodiments, the inert gas partial pressure prior to striking the inert plasma in operation 405 is reached in 10 seconds or less, and then the steady state temperature of the substrate is thereafter reached in 10 seconds or less. In operation 409, the inert plasma is thereafter maintained, along with the heated pedestal, so that the substrate is heated by a combination of the inert plasma and the thermal radiation from the heated pedestal. As described in more detail below, this heating combination advantageously reduces the temperature soak time while also improving nonuniformity.

In some embodiments, the substrate is first heated by only thermal radiation from the substrate support, and then heated by a combination of the inert plasma and the thermal radiation from the substrate support. For example, in FIG. 4, operation 403 may be performed for a first period, such as between 5 seconds and 10 seconds, after which the inert plasma may be generated in operation 407 such that in operation 409 the substrate is heated for a second period, such as between about 10 and 15 seconds, using the combination of the maintained inert plasma and the heated pedestal. In some embodiments, the inert gas flow into the chamber and onto the substrate of operation 405 may occur during or after the first time period while the plasma is not generated. In one example, the first and second periods may both be 10 seconds, the pressure may remain constant during the first and second periods, and the inert gas may be flowing onto the substrate during both the first and second periods and may be a constant flow rate, such as 10,000 sccm. For some substrates, heating the substrate first with only thermal radiation, and then by both thermal radiation and the inert plasma, may be advantageous because this 2-step heating may reduce damage and film adhesion to the substrate that may otherwise be caused by exposing the substrate to the inert plasma when the substrate is at too low of a temperature. For instance, some substrates may be damaged or delaminated when a substrate at a temperature below 250-300° C. is exposed to a plasma for a 400° C. deposition process.

During at least a part of the temperature soak operations described in FIGS. 3 and 4, such as operations 305, and 403-409, the substrate may also undergo additional pre-deposition processing. For example, this may include flowing a surface treatment gas that may include a cleaning molecule, such as an ammonia, and a surface treatment molecule, such as adding interfacial bonds, as well as adhesion.

Figure 5:
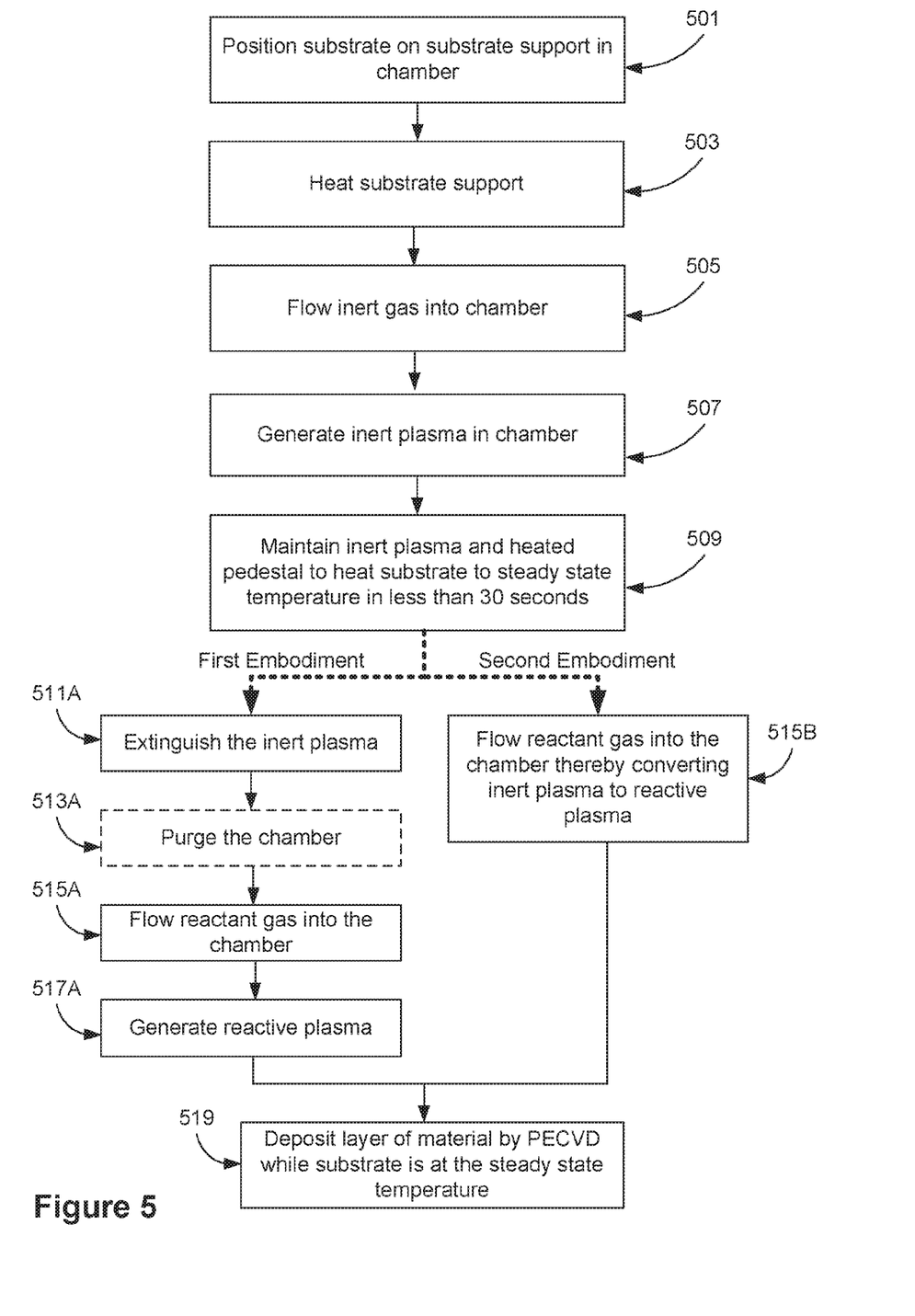
FIG. 5 depicts a third example process flow diagram for performing operations in accordance with disclosed embodiments.

After the temperature soak of the substrate operations of FIGS. 3 and 4, PECVD deposition may be performed while the substrate is at the desired operating (or steady state) temperature to deposit a layer of material on the substrate. In some embodiments, the inert plasma may be extinguished after the temperature soak and then a reactive plasma may be ignited and maintained for the PECVD deposition, while in some other embodiments the inert plasma is not extinguished but instead maintained and converted to a reactive plasma for the PECVD deposition. FIG. 5 depicts a third example process flow diagram for performing operations in accordance with disclosed embodiments. Operations 501-509 may be the same as operations 401-409 above. Here in FIG. 5 after operation 509, two alternative embodiments of operations are depicted with the first embodiment extinguishing the inert plasma and then igniting a reactive plasma for the PECVD deposition and the second embodiment not extinguishing but maintaining the inert plasma and converting it to a reactive plasma for PECVD deposition.

The first alternative embodiment of FIG. 5 may include operations 511A, 513A (optionally), 515A, 517A, and 519. In operation 511A, the inert plasma is extinguished which may include terminating the RF power and, in some embodiments, stopping the flow of the inert gas into the chamber. Next, the optional purge operation of 513A may be performed in order to remove particles and other gases from the chamber. This may include the continuous flow of the inert gas or a flow of another purge gas. Next, operation 515A may be performed which flows a reactant gas into the chamber. In some embodiments, both the inert gas and the reactant gas may be simultaneously flowed into the chamber in operation 515A. The reactant gas may be any of those described above, such as a silicon, a silane, a tetra-ethoxy-silane, and a tetra-methyl-silane. While the reactant gas is being flowed into the chamber, the reactive plasma may be generated in operation 517A which therefore drives the PECVD reaction while the substrate is at the steady state temperature of operation 519 in order to deposit the layer of material onto the substrate.

This first alternative embodiment may be advantageous because adjustments to various processing conditions may be made after the temperature soak operations. Although not depicted in FIG. 5, optional operations may be performed which adjust one or more process conditions, such as changing the pressure of the chamber, adjusting the frequency of the plasma, and adjusting the power of the plasma. For example, the temperature soak operations may be performed with an inert plasma having only a HF component and a first power level that is advantageous to heating the substrate, while the deposition operation 519 may be performed with a reactive plasma with a different power level, both LF and HF components, or just a LF component; the pressure may also be different than during the temperature soak. It may also be advantageous to extinguish the plasma because the plasma may become unstable if adjustments are made to the inert plasma, such as changing the frequency component, power level, or other various deposition parameters.

The second alternative embodiment of FIG. 5 may include operation 515B in order to maintain and not extinguish the inert plasma. To do so, operation 515B is performed which flows the reactant gas into the chamber which thereby converts the inert plasma to the reactive plasma. In some embodiments, the inert gas may continue to flow during at least a part of operation 515B while the reactant gas is flowing, while in some other embodiments the inert gas may be stopped and only the reactant gas is flowed into the chamber. In some embodiments, the power level may be changed such that the inert plasma is at a first power lever and the reactive plasma is at a second power level. This second alternative embodiment may be advantageous because it may reduce process steps, and the corresponding time, that are performed to extinguish and re-ignite a plasma; this may include charging the gas line (i.e., flowing gas from a gas source to the chamber), power application to the chamber or station, and plasma stabilization (i.e., allowing the plasma to stabilize and confirming it is stable), all of which increase the processing time of the substrate.

The techniques described hereinabove are applicable to both single station and multi-station processing chambers. In the multi-station chambers, each step described above may be performed at two or more, including all, of the multiple stations. For example, the operations of FIGS. 3, 4, and 5 may all be performed simultaneously at each station of a multi-station processing chamber, like that of FIG. 2.

As also mentioned above, the controller 250 of the tools described above, 100 and 200, includes instructions for performing the techniques of FIGS. 3-5 described above. For example, the controller includes instructions to provide a first substrate onto a first substrate support, flow the inert gas onto the first substrate that is supported by the first substrate support, generate, while the inert gas is flowed onto the first substrate that is supported by the first substrate support, the inert plasma in the first process station, and maintain the inert plasma to thereby heat the first substrate to a steady state temperature, suitable for conducting plasma enhanced chemical vapor deposition, in less than 30 seconds from providing the first substrate onto the first substrate support. In some embodiments, the controller is also configured to cause first substrate support to generate heat using a heat source, and maintain the inert plasma while the first substrate support generates heat to thereby heat the first substrate to a steady state temperature by a combination of the inert plasma and radiation from the first substrate support. As noted above, the plasma source may be configured to generate the inert plasma at a frequency of 13.56 MHz and to generate the inert plasma at a power between 200 Watts and 800 Watts.

The controller may also be configured to flow a reactant gas onto the first substrate that is supported by the first substrate support, and generate, while the reactant gas is flowed onto the first substrate that is supported by the first substrate support, the reactant plasma in the first process station to thereby deposit a layer of material on the first substrate For multi-station processing chambers, the controller may be configured to perform all of the above operations in multiple stations. Accordingly, in addition to the operations regarding the first station above, the controller may be configured to provide a second substrate onto a second substrate support, flow the inert gas onto the second substrate that is supported by the second substrate support, generate, while the inert gas is flowed onto the second substrate that is supported by the second substrate support, the inert plasma in the first process station, and maintain the inert plasma in the second process station to thereby heat the second substrate to the steady state temperature in less than 30 seconds from providing the second substrate onto the second substrate support.

The controller may also cause second substrate support to generate heat, maintain the inert plasma while the second substrate support generates heat to thereby heat the second substrate to the steady state temperature by a combination of the inert plasma and radiation from the second substrate support, flow the reactant gas onto the second substrate that is supported by the second substrate support, and generate, while the reactant gas is flowed onto the second substrate that is supported by the second substrate support, the reactant plasma in the second process station to thereby deposit a layer of material on the second substrate.

Results

Figure 6:
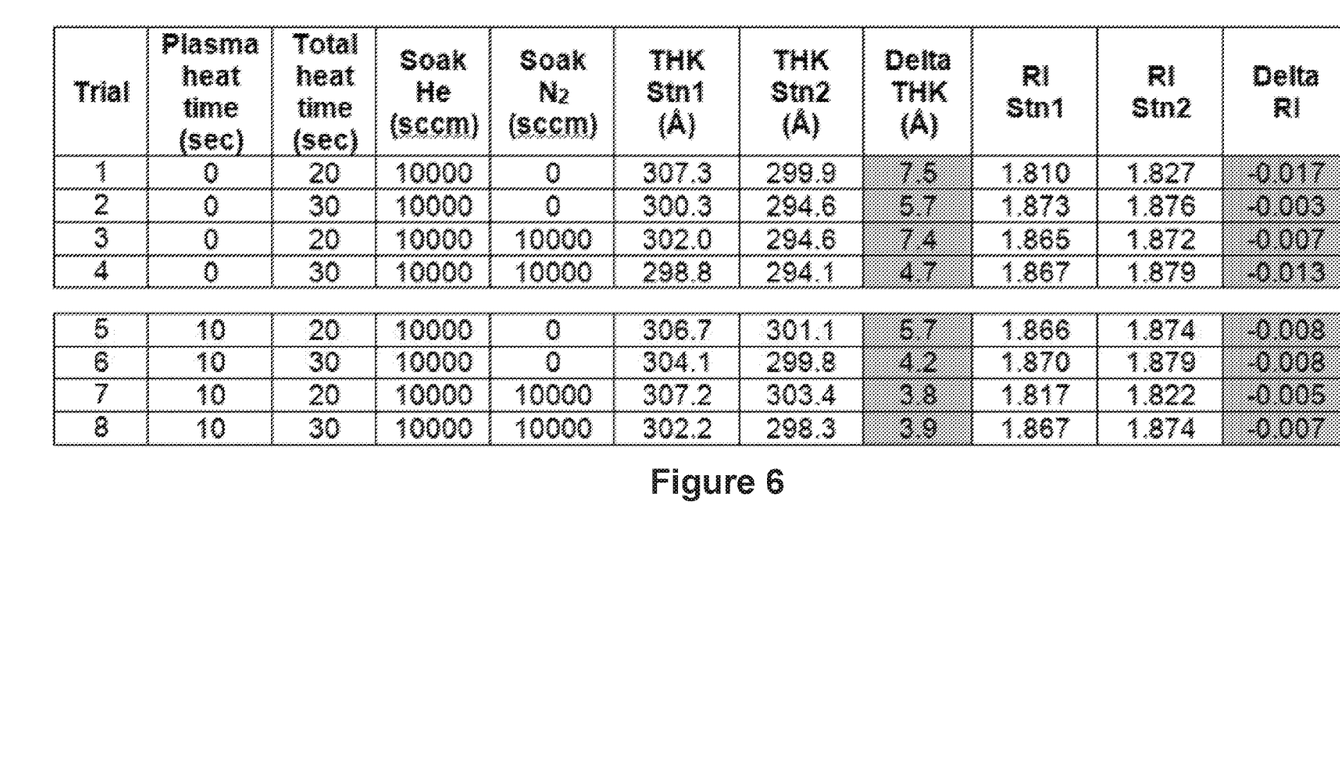
FIG. 6 depicts a table of various process conditions and measurements for processed substrates.

The techniques and apparatuses described above increase throughput and improve substrate performance, such as nonuniformity and refractive index (RI) of substrates. FIG. 6 depicts a table of various process conditions and measurements for processed substrates. Here, eight trial deposition processes were performed at a multi-station tool, with each trial including temperature soak and deposition processes on two substrates, one at each station. The difference in thickness (which may be considered nonuniformity) and the difference in RI between the two processed substrates were measured; it is desirable to have the differences between the characteristics of the deposited material between the two substrates as small as possible.

In trials 1-4 of FIG. 6, the temperature soak was a conventional substrate soak that did not use a plasma and instead used only a heated pedestal to heat the substrate to the operating temperature for PECVD. As can be seen for these four trials, inert gases He and $N_2$ were also flowed during the temperature soak, with only He flowed on the substrate in Trials 1 and 2, and a combination of He and $N_2$ flowed on the substrate in Trials 3 and 4. PECVD deposition was performed after the temperature soak operations in trials 1-4 and the measured thicknesses, in Angstroms, of the deposited layers on each substrate in the two stations is seen in the columns "THK Stn 1" and "THK Stn 2." The difference in these deposited layers is depicted in the shaded column titled "Delta THK". Similarly, the RI for each substrate was measured, which is depicted in the two columns titled "RI Stn1" and "RI Stn2," the difference in these measured RIs is shown in the other shaded column titled "Delta RI."

In trials 5-8 of FIG. 6, the temperature soak processes did use a combination of both an inert plasma and heated pedestal according to the embodiments described herein. The temperature soak operations were performed for various times and with various inert gases flowing onto the substrates. For example, in trial 5, the temperature soak was performed for 20 total seconds which included 10 seconds of heating with the heated pedestal and 10 seconds of heating with the combination of the heated pedestal and the inert plasma, during which only helium was flowing onto the substrate. In another example, in trial 8, the temperature soak was performed for 30 total seconds which included 20 seconds of heating with the heated pedestal and 10 seconds of heating with the combination of the heated pedestal and the inert plasma, during which both helium and $N_2$ were flowing onto the substrate. PECVD deposition using the same conditions as in trials 1-4 was performed after the temperature soak and the differences in thicknesses and RIs were measured.

As can be seen in FIG. 6, the trials that utilized a temperature soak with both the inert plasma and heated pedestal according to the embodiments described herein overall had improved performances over the trials that used the conventional heating. For example, trials 6-8 all had lower differences in thicknesses between substrates than trials 1-4, and trials 5-8 all had lower differences in RIs than trials 1 and 4. Although trial 5, which had the largest difference in thickness between substrates, matched that of trial 2 and was greater than trial 4, trial 5 had a lower RI difference than trial 4.

Additionally, trials 1-4 correspond with trials 5-8, respectively, such that they have the same process conditions except for the inert plasma exposure; when the two corresponding non-plasma/plasma trials are compared to each other, the results show a great improvement. For instance, trial 1 corresponds with trial 5 in that they include the same soak time, the same inert gas flow, and the same deposition process conditions; the only difference is that trial 5 includes 10 seconds of inert plasma during the overall 20 seconds of temperature soak time. In another instance, trial 4 corresponds with trial 8; they both include the same soak time of 30 seconds, the same inert gas flow of He and $N_2$ at 10,000 sccm, and the same deposition process conditions; trial 8 includes 10 seconds of inert plasma exposure during the 30 seconds soak time. Similarly, trials 2 and 6, and 3 and 7, correspond to each other and differ in the use of inert plasma heating.

When these corresponding trials are compared to each other, all of the trials that use both a plasma and heated pedestal resulted in an improved, smaller difference in substrate thicknesses than compared to the corresponding trials without plasma heating. For instance, trial 5 reduced the difference in thickness of trial 1 from 7.5 Å to 5.7 Å, trial 6 reduced the difference in thickness from trial 2 from 5.7 Å to 4.2 Å, trial 7 reduced the difference in thickness of trial 3 from 7.4 Å to 3.8 Å, and trial 8 reduced the difference in thickness of trial 4 from 4.7 Å to 3.9 Å. Nearly all of trials 5-8 also resulted in an improved, reduced RI difference as compared to the corresponding trial 1-4. For example, trial 5 reduced the difference in RI trial 1 from –0.017 to –0.008, trial 7 reduced the difference in RI trial 3 from –0.007 to –0.005, and trial 8 reduced the difference in RI trial 4 from –0.013 to –0.007.

Figure 7:
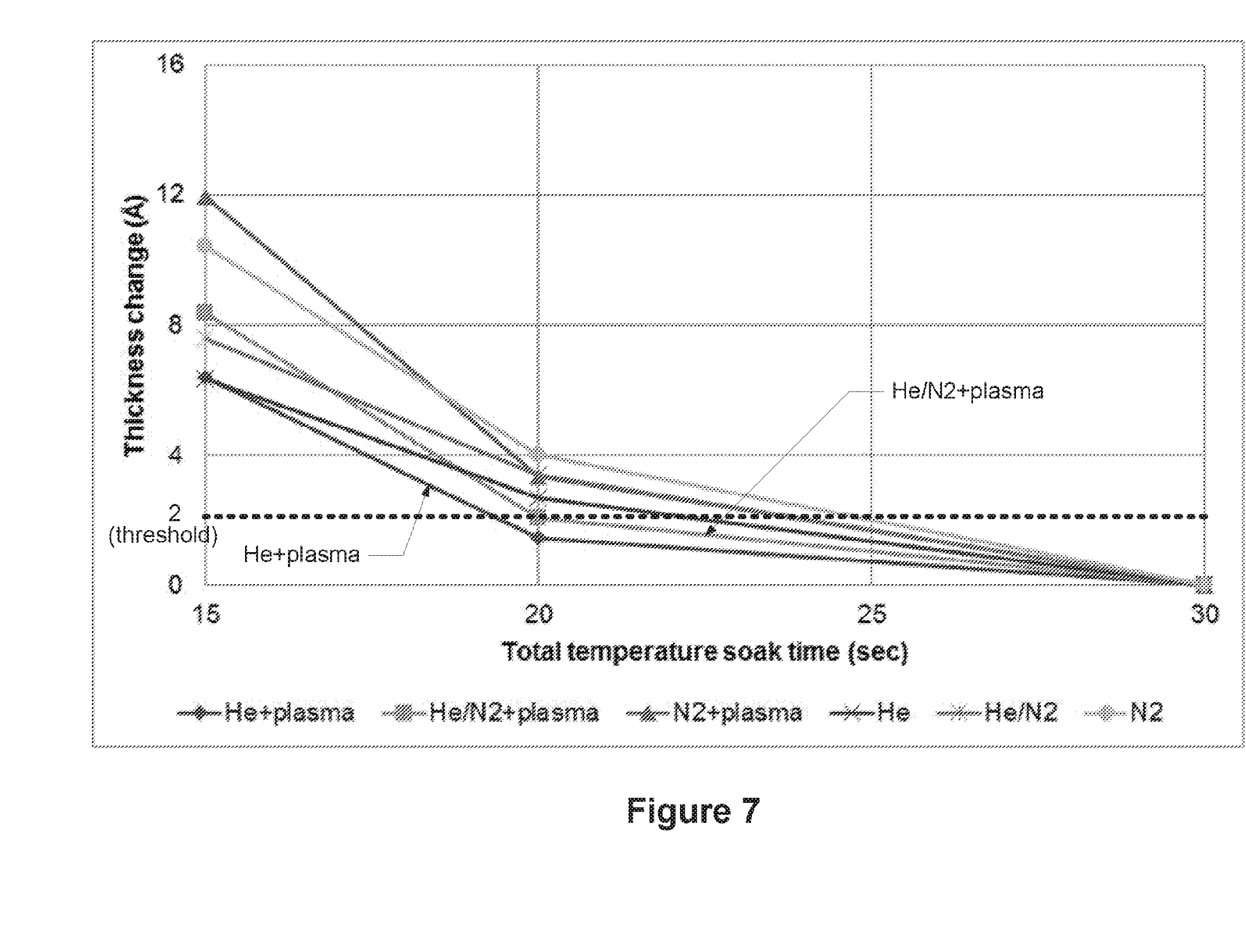
FIG. 7 depicts a graph of substrate thickness changes compared to temperature soak times.

The techniques and apparatuses described above may also increase throughput. FIG. 7 depicts a graph of substrate thickness changes compared to temperature soak times. Similar to Figure GG, here in FIG. 7 six trials were performed on substrates in a multi-station deposition chamber, with each trial having temperature soak and PECVD deposition processes performed on two substrates, one in each station. Three trials heated the substrates using only a heated pedestal and the other three trials used a combination of an inert plasma and a heated pedestal to heat the substrate during the temperature soak. The differences between the deposited thicknesses on the two substrates were measured like above and are represented in the vertical axis with the temperature soak time represented in the horizontal axis. In many PECVD deposition processes, there is an acceptable difference between the substrate thicknesses, or tolerance, such as 2 Å, as represented by the dotted horizontal line.

As can be seen in FIG. 7, as the soak time increases, the differences in thicknesses of these six trials all decrease and eventually fall below the 2 Å tolerance. In order to improve throughput, it is desirable to perform the temperature soak for the least amount of time while still achieving the desired performance characteristics, which in this example is a difference in thickness of less than or equal to 2 Å. In FIG. 7, only two trials are within this 2 Å tolerance after a 20 second soak time, and these two trials (He and plasma, and He/$N_2$ and plasma) use the combination of the inert plasma and the heated pedestal.

While the subject matter disclosed herein has been particularly described with respect to the illustrated embodiments, it will be appreciated that various alterations, modifications and adaptations may be made based on the present disclosure, and are intended to be within the scope of the present invention. It is to be understood that the description is not limited to the disclosed embodiments but, on the contrary, is intended to cover various modifications and equivalent arrangements included within the scope of the claims.

What is claimed is:

1. A method comprising:
    providing a substrate onto a substrate support in a processing chamber;
    generating an inert plasma in the processing chamber;
    maintaining the inert plasma to heat the substrate to a steady state temperature, suitable for conducting plasma-enhanced chemical vapor deposition (PECVD), in less than 30 seconds from providing the substrate onto the substrate support; and
    depositing, while the substrate is at the steady state temperature and while a reactant plasma is generated in the processing chamber, a layer of material on the substrate by PECVD,
    wherein the depositing comprises flowing a reactant process gas onto the substrate while maintaining the inert plasma and thereby changing the inert plasma to the reactant plasma without extinguishing the inert plasma.

2. The method of claim 1, wherein:
    the substrate support is heated, and
    the substrate is heated by a combination of the inert plasma and radiation from the substrate support.

3. The method of claim 2, wherein the substrate is first heated by radiation from the substrate support and then heated by the combination of the inert plasma and radiation from the substrate support.

4. The method of claim 1, wherein the substrate is heated from room temperature to a temperature of between 300° C. and 700° C.

5. The method of claim 1, wherein the generating the inert plasma comprises:
    flowing an inert gas into the processing chamber, and
    striking the inert plasma.

6. The method of claim 5, wherein the inert gas is selected from the group consisting of helium, nitrogen, and a combination of helium and nitrogen.

7. The method of claim 5, wherein a chamber partial pressure during the flowing of the inert gas is 1-10 Torr.

8. The method of claim 1, wherein the inert plasma is generated at a first power level and the reactant plasma is generated at a second power level.

9. The method of claim 1, further comprising:
    flowing, during the maintaining of the inert plasma, a surface treatment gas that comprises one or more of: a cleaning molecule and a surface treatment molecule,
    wherein the cleaning molecule comprises ammonia, and
    wherein the surface treatment molecule adds interfacial bonds and adhesion.

10. An apparatus comprising:
    a processing chamber;
    a first process station that includes a first substrate support, wherein the first substrate support is configured to position a first substrate in the processing chamber;
    a process gas unit configured to flow an inert gas onto the first substrate supported by the first substrate support;
    a plasma source configured to generate an inert plasma in the first process station; and a controller, wherein the controller includes instructions that are configured to:
provide the first substrate onto the first substrate support,
flow the inert gas onto the first substrate that is supported by the first substrate support,
generate, while the inert gas is flowed onto the first substrate that is supported by the first substrate support, the inert plasma in the first process station, and
maintain the inert plasma to thereby heat the first substrate to a steady state temperature, suitable for conducting plasma enhanced chemical vapor deposition, in less than 30 seconds from providing the first substrate onto the first substrate support,
wherein the plasma source is configured to generate the inert plasma at a power between 200 Watts and 2500 Watts.

11. The apparatus of claim 10, wherein:
the first substrate support is further configured to generate heat to heat the first substrate that is supported by the first substrate support, and
the controller further includes instructions that are configured to:
cause first substrate support to generate heat, and
maintain the inert plasma while the first substrate support generates heat to thereby heat the first substrate to a steady state temperature by a combination of the inert plasma and radiation from the first substrate support.

12. The apparatus of claim 10, wherein:
the process gas unit is further configured to flow a reactant gas onto the first substrate supported by the first substrate support,
the plasma source is configured to generate a reactant plasma in the first process station, and
the controller further includes instructions that are configured to:
flow the reactant gas onto the first substrate that is supported by the first substrate support; and
generate, while the reactant gas is flowed onto the first substrate that is supported by the first substrate support, the reactant plasma in the first process station to thereby deposit a layer of material on the first substrate.

13. The apparatus of claim 10, further comprising a second process station, wherein:
the second process station includes a second substrate support, wherein the second substrate support is configured to position a second substrate in the processing chamber,
the process gas unit is further configured to flow the inert gas onto the second substrate supported by the second substrate support,
the plasma source is further configured to generate the inert plasma in the second process station, and
the controller further includes instructions that are configured to:
provide the second substrate onto the second substrate support,
flow the inert gas onto the second substrate that is supported by the second substrate support,
generate, while the inert gas is flowed onto the second substrate that is supported by the second substrate support, the inert plasma in the first process station, and
maintain the inert plasma in the second process station to thereby heat the second substrate to the steady state temperature in less than 30 seconds from providing the second substrate onto the second substrate support.

14. The apparatus of claim 13, wherein:
the second substrate support is further configured to generate heat to heat the second substrate that is supported by the second substrate support, and
the controller further includes instructions that are configured to:
cause second substrate support to generate heat, and
maintain the inert plasma while the second substrate support generates heat to thereby heat the second substrate to the steady state temperature by a combination of the inert plasma and radiation from the second substrate support.

15. The apparatus of claim 14, wherein:
the process gas unit is further configured to flow a reactant gas onto the second substrate supported by the second substrate support,
the plasma source is further configured to generate a reactant plasma in the second process station, and
the controller further includes instructions that are configured to:
flow the reactant gas onto the second substrate that is supported by the second substrate support; and
generate, while the reactant gas is flowed onto the second substrate that is supported by the second substrate support, the reactant plasma in the second process station to thereby deposit a layer of material on the second substrate.

16. The apparatus of claim 15, wherein the reactant gas comprises a silicon, a silane, a tetra-ethoxy-silane, and/or a tetra-methyl-silane.

17. The apparatus of claim 10, wherein the inert gas comprises one or more of: helium, nitrogen, and a combination of helium and nitrogen.

18. A method comprising:
providing a substrate onto a substrate support in a processing chamber;
generating an inert plasma in the processing chamber;
maintaining the inert plasma to heat the substrate to a steady state temperature, suitable for conducting plasma-enhanced chemical vapor deposition (PECVD), in less than 30 seconds from providing the substrate onto the substrate support;
depositing, while the substrate is at the steady state temperature and while a reactant plasma is generated in the processing chamber, a layer of material on the substrate by PECVD; and
extinguishing the inert plasma after the substrate reaches the steady state temperature and before the depositing, wherein the depositing further comprises:
flowing, a reactant process gas onto the substrate, and
generating the reactant plasma in the processing chamber.

* * * * *